United States Patent
Su et al.

(10) Patent No.: US 10,855,231 B2
(45) Date of Patent: Dec. 1, 2020

(54) TEMPERATURE COMPENSATION CIRCUIT AND RADIO FREQUENCY POWER AMPLIFYING CIRCUIT FOR RADIO FREQUENCY POWER AMPLIFIER

(71) Applicant: SMARTER MICROELECTRONICS (GUANG ZHOU) CO., LTD., Guangzhou (CN)

(72) Inventors: Qiang Su, Guangzhou (CN); Baiming Xu, Guangzhou (CN); Jiangtao Yl, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 0 days.

(21) Appl. No.: 16/665,674

(22) Filed: Oct. 28, 2019

(65) Prior Publication Data
US 2020/0067463 A1 Feb. 27, 2020

Related U.S. Application Data

(63) Continuation of application No. PCT/CN2018/077264, filed on Feb. 26, 2018.

(30) Foreign Application Priority Data

Jun. 12, 2017 (CN) .......................... 2017 1 0436998

(51) Int. Cl.
*H03F 1/30* (2006.01)
*H03F 3/24* (2006.01)
*H04B 1/40* (2015.01)

(52) U.S. Cl.
CPC ............. *H03F 1/301* (2013.01); *H03F 3/245* (2013.01); *H03F 2200/129* (2013.01); *H03F 2200/447* (2013.01); *H03F 2200/451* (2013.01); *H04B 1/40* (2013.01)

(58) Field of Classification Search
CPC ................ H03F 1/30; H03F 3/20; H03G 3/30
USPC .................................. 330/289, 293, 296, 285
See application file for complete search history.

(56) References Cited

U.S. PATENT DOCUMENTS

| | | | | |
|---|---|---|---|---|
| 6,091,302 A * | 7/2000 | Arevalo | ................... | H03F 1/306 330/277 |
| 7,323,939 B2 * | 1/2008 | Han | ........................ | H03F 1/223 330/305 |
| 8,970,297 B2 * | 3/2015 | Lin | ......................... | H03F 3/602 330/124 R |

* cited by examiner

*Primary Examiner* — Henry Choe
(74) *Attorney, Agent, or Firm* — Syncoda LLC; Feng Ma (57) ABSTRACT

A temperature compensation circuit for a radio frequency power amplifier includes: a temperature control circuit and a negative feedback circuit; the temperature control circuit is configured to generate a first electrical signal corresponding to a temperature, and according to the first electrical signal, adjust a second electrical signal at a first node; the negative feedback circuit is configured to provide, on the basis of the second electrical signal, a negative feedback signal to the radio frequency power amplifier by means of a second node; the second electrical signal is used to change the resistance value of the negative feedback circuit so as to adjust a negative feedback signal that is associated with the resistance value; the negative feedback signal is used to be inputted into the radio frequency power amplifier such that the gain of the radio frequency power amplifier changes.

9 Claims, 6 Drawing Sheets

TEMPERATURE COMPENSATION CIRCUIT AND RADIO FREQUENCY POWER AMPLIFYING CIRCUIT FOR RADIO FREQUENCY POWER AMPLIFIER

CROSS-REFERENCE TO RELATED APPLICATIONS

The present application is filed based upon and claims benefit of Chinese Patent Application No. 201710436998.3, filed on Jun. 12, 2017, the contents of which are hereby incorporated by reference in its entirety.

BACKGROUND

In mobile communication systems, the efficiency and linearity of a radio frequency power amplifier directly affect the energy consumption and quality of the communication process. A terminal device needs to operate normally in different scenarios and regions. This requires the radio frequency power amplifier to at least operate at a temperature range from −25° C. to 85° C. That is, the performance of the radio frequency power amplifiers can satisfy the requirements of mobile communication protocols for the power consumption and the linearity in low temperature and high temperature environments.

SUMMARY

The disclosure relates generally to the technical field of electronics, and more specifically to a temperature compensation circuit for a radio frequency amplifier, and a radio frequency power amplifying circuit.

In view of this, the embodiment of the disclosure is directed to a temperature compensation circuit for a radio frequency amplifier, and a radio frequency power amplifying circuit, which at least partially solve the problem that the linearity of the radio frequency power amplifier deteriorates due to a temperature.

The technical solution of the embodiment of the disclosure is implemented as follows.

The embodiment of the disclosure provides a temperature compensation circuit for a radio frequency power amplifier. The temperature compensation circuit includes a temperature control circuit and a negative feedback circuit.

The temperature control circuit is connected to the negative feedback circuit, and configured to generate a first electrical signal corresponding to a temperature, and adjust a second electrical signal on a first node according to the first electrical signal. The first node is a point on a connection between the temperature control circuit and the negative feedback circuit.

The negative feedback circuit is connected to an input of the radio frequency power amplifier, and configured to provide a negative feedback signal for the radio frequency power amplifier based on the second electrical signal. The second electrical signal is used to change a resistance value of the negative feedback circuit to adjust the negative feedback signal associated with the resistance value.

The negative feedback signal is configured to be inputted into the radio frequency power amplifier such that a gain of the radio frequency power amplifier changes.

The embodiment of the disclosure further provides a radio frequency power amplifying circuit, which includes a temperature compensation circuit and a radio frequency power amplifier.

The temperature compensation circuit includes a temperature control circuit and a negative feedback circuit.

The temperature control circuit is configured to generate a first electrical signal corresponding to a temperature, and adjust a second electrical signal on a first node according to the first electrical signal. The first node is a point on a connection between the temperature control circuit and the negative feedback circuit.

The negative feedback circuit is configured to provide a negative feedback signal for the radio frequency power amplifier through a second node based on the second electrical signal. The second electrical signal is used to change a resistance value of the negative feedback circuit to adjust the negative feedback signal associated with the resistance value. The second node is a point on a connection between the negative feedback circuit and an input of the radio frequency power amplifier.

The negative feedback signal is configured to be inputted into the radio frequency power amplifier such that a gain of the radio frequency power amplifier changes.

The radio frequency power amplifier includes at least one input and at least one output and configured to amplify an input signal.

The input of the radio frequency power amplifier is connected to the second node and configured to receive the input signal.

The output of the radio frequency power amplifier is connected to the negative feedback circuit through a third node to output an output signal amplified from the input signal. The gain of the radio frequency power amplifier changes with a temperature. The third node is a point on a connection between the negative feedback circuit and the output of the radio frequency power amplifier.

According to the temperature compensation circuit for a radio frequency power amplifier and the radio frequency power amplifying circuit in the embodiment of the disclosure, the temperature compensation circuit is provided with a temperature control circuit and a negative feedback circuit. The temperature control circuit may generate a second electrical signal corresponding to a temperature, and provide the second electrical signal for the negative feedback circuit. The negative feedback circuit provides, based on the second electrical signal, a negative feedback signal associated with the temperature for the radio frequency power amplifier. After the negative feedback signal here is inputted to the radio frequency power amplifier, the radio frequency power amplifier may generate an opposite effect to the temperature, thereby weakening the influence of the temperature on the radio frequency power amplifier, solving the problem in the related art that of the amplification linearity of the radio frequency power amplifier deteriorates due to the influence of temperature compensation of a bias circuit on an operating point of the amplifier, stabilizing the operating point of the radio frequency power amplifier, and improving the stability and operating efficiency of the radio frequency power amplifying circuit.

DETAILED DESCRIPTION

Due to the temperature characteristics of a transistor, an operating point of the radio frequency power amplifier change. Generally, as the temperature rises, a gain of the radio frequency power amplifier decreases; and as the temperature drops, the gains of the amplifiers increase.

However, the temperature characteristics of the transistor may cause the performance of the radio frequency power amplifier to deteriorate, failing to satisfy the indexes of the mobile communication protocols for the power consumption and the linearity. An effective solution is to add a temperature compensation circuit to the radio frequency power amplifiers to compensate for the temperature characteristics of the transistor.

A common temperature compensation circuit of the radio frequency power amplifier has the following problems. At a high temperature, a bias current Id of the radio frequency power amplifier is raised by the temperature compensation circuit, which results in that a DC operating point of the amplifier is raised, the power consumption of the circuit is increased, the operating temperature of the radio frequency power amplifier is raised, and an amplification linearity of the radio frequency power amplifier is deteriorated. At a low temperature, the bias current Id of the radio frequency power amplifier is pulled down by the temperature compensation circuit, and the DC operating point of the radio frequency power amplifier is lowered, which results in that the gain of the radio frequency power amplifier is raised when the radio frequency power amplifier operates at a large signal, and the linearity of the radio frequency power amplifier deteriorates when the power is back off. The DC operating point here is an operating point in which the amplifier is in the DC state when an input signal of the radio frequency power amplifier is zero.

In some embodiment of the disclosure, a temperature compensation circuit for a radio frequency power amplifier is used to compensate for the influence of a temperature on a gain of the radio frequency power amplifier, so that the radio frequency power amplifier operates in a linear operating area to amplify an input signal. The temperature compensation circuit includes a temperature control circuit and a negative feedback circuit. The temperature control circuit generates a first electrical signal corresponding to a temperature, and adjusts a second electrical signal on a first node according to the first electrical signal. The second electrical signal is provided for the negative feedback circuit through the first node to change a resistance value of the negative feedback circuit in the negative feedback circuit so as to adjust a negative feedback signal fed back to the radio frequency power amplifier such that the gain of the radio frequency power amplifier changes, and temperature compensation is performed on the radio frequency power amplifier.

In order to more fully understand the features and technical aspects of the disclosure, the implementation of the disclosure will be described in detail below with reference to the accompanying drawings. It is to be understood that preferred embodiments described below are only used for describing and explaining the disclosure and not intended to limit the disclosure.

Figure 1:
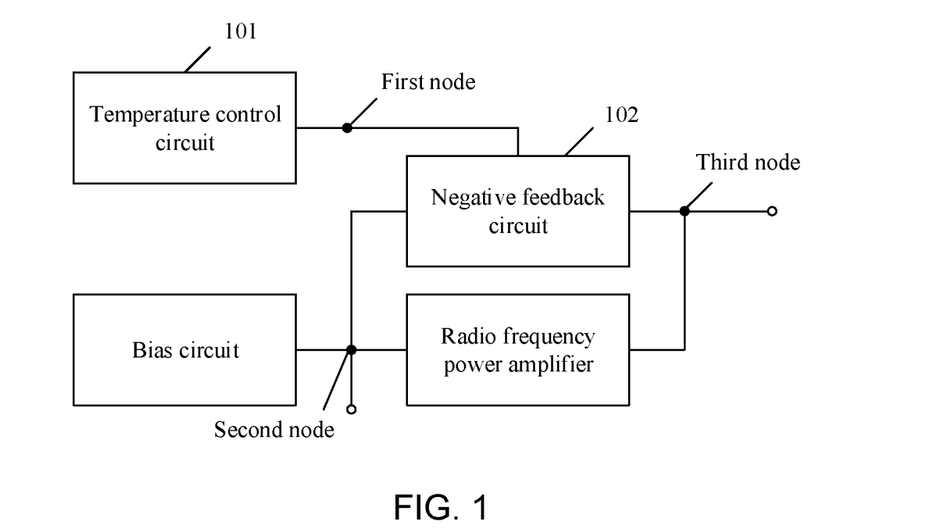
FIG. 1 is a schematic diagram of a composition structure of a temperature compensation circuit for a radio frequency power amplifier according to an embodiment of the disclosure.

In the embodiment of the disclosure, a basic composition structure of the temperature compensation circuit for a radio frequency power amplifier is illustrated in FIG. 1. The temperature compensation circuit includes a temperature control circuit 101 and a negative feedback circuit 102.

The temperature control circuit 101 is configured to generate a first electrical signal corresponding to a temperature, and adjust a second electrical signal on a first node according to the first electrical signal. The first node is any point on a connection between the temperature control circuit and the negative feedback circuit.

The operation that the temperature control circuit 101 generates the first electrical signal corresponding to the temperature includes the following actions. The temperature control circuit 101 may generate, according to the change of the temperature, a first electrical signal changing with the temperature. When the temperature rises or drops, the first electrical signal is increased or decreased, where the first electrical signal may be a voltage signal or a current signal. The operation that a second electrical signal on the first node is adjusted according to the first electrical signal includes the following actions. Since the first node connects the temperature control circuit 101 and the negative feedback circuit 102, when the first electrical signal changes with the temperature, the electrical signal on the first node may change, that is, the second signal may also change with the temperature. The second electrical signal may be a voltage signal or a current signal.

The negative feedback circuit 102 is configured to provide a negative feedback signal for the radio frequency power amplifier through a second node based on the second electrical signal. The second electrical signal is used to change a resistance value of the negative feedback circuit to adjust a negative feedback signal associated with the resistance value. The second node is any point on a connection between the negative feedback circuit and an input of the radio frequency power amplifier.

The negative feedback signal is used to be inputted into the radio frequency power amplifier such that a gain of the radio frequency power amplifier changes. The negative feedback signal changes with the change of the second electrical signal on the first node. After being inputted into the radio frequency power amplifier, the negative feedback signal acts as a reaction to the gain of the radio frequency power amplifier relative to the action of the temperature on the gain, and the change caused by the influence of the temperature on the gain of the radio frequency power amplifier may be offset. The negative feedback circuit provides a negative feedback signal for the radio frequency power amplifier through a second node based on the second electrical signal, the negative feedback signal including the following effects. A resistance value of the negative feedback circuit is controlled by the second electrical signal. The second electrical signal is used to change the resistance value of the negative feedback circuit to adjust the negative feedback signal associated with the resistance value. When the second electrical signal changes with the temperature, the resistance value of the negative feedback circuit also changes with the second electrical signal, thereby changing the negative feedback signal associated with the resistance value. One end of the negative feedback circuit is connected to an input of the radio frequency power amplifier through a second node to provide the negative feedback signal for the radio frequency power amplifier through the second node. The other end of the negative feedback circuit is connected to an output of the radio frequency power amplifier through a third node.

Figure 2:
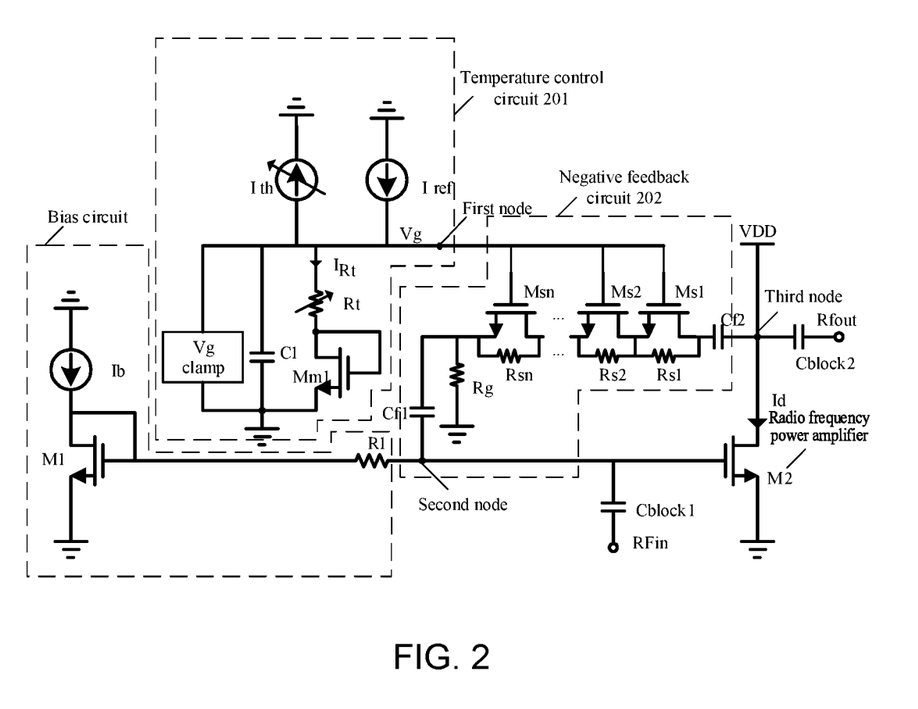
FIG. 2 is a schematic diagram of a specific composition structure of a temperature compensation circuit for a radio frequency power amplifier according to an embodiment of the disclosure.

In one embodiment, a specific composition structure of the temperature compensation circuit for a radio frequency power amplifier is illustrated in FIG. 2. The temperature compensation circuit includes a temperature control circuit 201 and a negative feedback circuit 202.

The temperature control circuit 201 includes a temperature control power supply, a steady state power supply, a clamping circuit, a filter circuit, and an adjustable resistor circuit.

The temperature control power supply is connected to the adjustable resistor circuit through the first node, and configured to provide an electrical signal that changes with a temperature for the adjustable resistor circuit. The electrical signal of the temperature control power supply is proportional to an absolute temperature.

The steady state power supply is connected to the adjustable resistor circuit through the first node, and configured to provide an electrical signal having a fixed value for the adjustable resistor circuit. The electrical signal of the steady state power supply does not change with the temperature.

Figure 3:
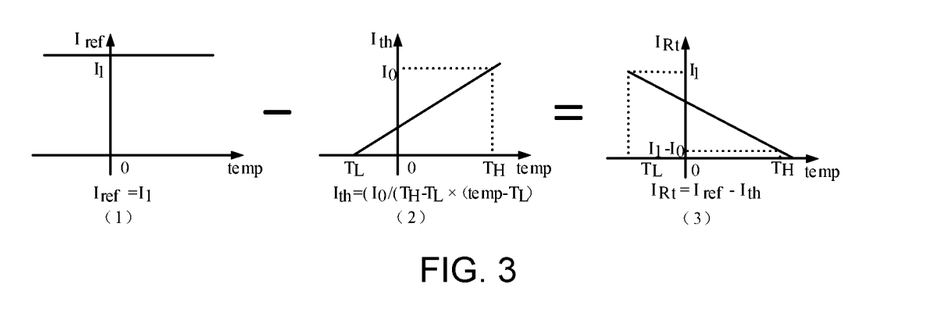
FIG. 3 is a schematic diagram of a relationship between electrical signals generated by a temperature control power supply and a steady state power supply and a temperature according to an embodiment of the disclosure.

In this embodiment, the temperature control power supply and the steady state power supply are both current sources, and a relationship between electrical signals generated by the temperature control power supply and the steady state power supply and a temperature is illustrated in FIG. 3. FIG. 3, panel (1) illustrates a linear relationship between a current signal of the steady state power supply and the temperature. Iref represents the current signal of the steady state power supply, $I_1$ is a fixed value of the steady state power supply, and temp represents the temperature. In FIG. 3, panel (2), $I_{th}$ represents a linear relationship between a current signal of the temperature control power supply and the temperature, $I_0$ represents a maximum adjustable value of the current signal, temp represents the temperature, $T_H$ and $T_L$ respectively represent upper and lower limits of the temperature. An operating temperature range of the temperature control power supply is from −25° C. to 85° C. An expression of $I_{th}$ is: $I_{th}=(I_0/(T_H-T_L))\times(\text{temp}-T_L)$, and Iref and $I_{th}$ are opposite in direction. FIG. 3, panel (3) is a schematic diagram of a linear relationship between a current signal $I_{Rt}$ and the temperature temp after Iref and $I_{th}$ opposite in direction are offset. The current signal $I_{Rt}$ is also the current signal of the adjustable resistor circuit, where $I_{Rt}=\text{Iref}-I_{th}$.

The clamping circuit is connected to the first node, and configured to limit an upper limit of the second electrical signal. The upper limit of the second electrical signal is represented by Vg Clamp in FIG. 2. The clamping circuit may be a simple clamping circuit consisting of circuit components such as a diode, a capacitor and a resistor, or may be a triode clamping circuit consisting of circuit components such as a triode, a capacitor, and a resistor. In short, a value of the electrical signal may be fixed within a specified range, thereby realizing a function of stabilizing the electrical signal in the circuit. The clamping circuit having the function of stabilizing the electrical signal may be used in the circuit of the embodiment of the present disclosure.

The filter circuit is connected to the first node, and configured to filter out an interference signal in the second electrical signal. The filter circuit may consist of capacitors represented by C1 in FIG. 2.

Figure 4:
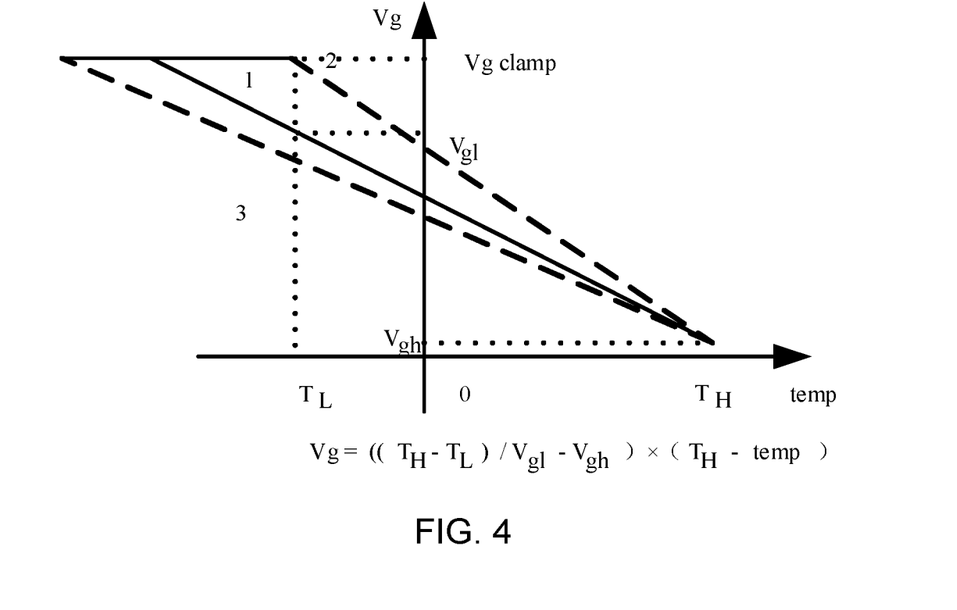
FIG. 4 is a schematic diagram of change of second electrical signals corresponding to resistance values of different adjustable resistors with a temperature according to an embodiment of the disclosure.

The adjustable resistor circuit is connected to the first node, and configured to adjust the second electrical signal. The adjustable resistor circuit consists of an adjustable resistor Rt and a transistor Mm1 connected in series, a slope of an oblique line indicating the second electrical signal on the first node to change with a temperature may be adjusted by the adjustable resistor Rt, and a specific change relationship is illustrated in FIG. 4. The second electrical signal is a voltage signal on the first node. According to the Ohm's law, a voltage Vg on the first node may be expressed as $Vg=((T_H-T_L)/V_{g1}-V_{gh})\times(T_H-\text{temp})$, where $V_{g1}$ is a value of Vg in a first oblique line when temp=$T_L$, and $V_{gh}$ is a value of Vg in the first oblique line when temp=$T_L$. The first, second and third oblique lines in FIG. 4 respectively represent a linear relationship between Vg and temp when Rt takes different values. It can be seen that, by adjusting Rt, the slope of the linear relationship between Vg and temp may be changed. Mm1 may offset fluctuations of a threshold voltage of a group of transistors in series in a negative feedback circuit with the process. In an application where a requirement of a temperature compensation performance is not high, Mm1 may be removed to save a chip area.

The negative feedback circuit 202 includes a transistor group circuit, a resistor circuit, a first capacitor, and a second capacitor.

Figure 5:
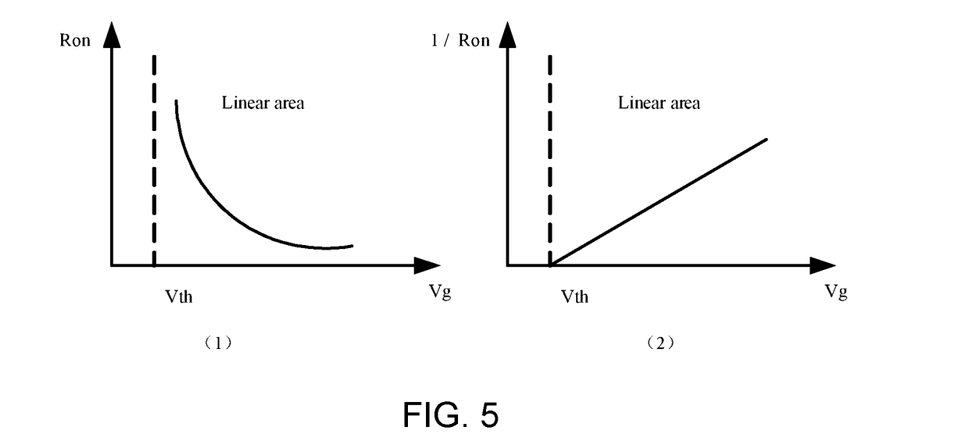
FIG. 5 is a schematic diagram of a relationship between the equivalent on-resistance and a gate voltage of a transistor according to an embodiment of the disclosure.

The transistor group circuit includes n transistors connected in series. An input of the transistor is connected to the first node, and configured to cause a resistance value of the negative feedback circuit to change with the second electrical signal. The transistor group circuit includes n transistors connected in series, Ms1, Ms2, . . . , Msn, n being a positive integer greater than 3. A gate of each transistor is connected to the first node. A gate voltage of each transistor is controlled by the second electrical signal on the first node, that is, Vg. When the transistor operates in a linear operating area, an equivalent on-resistance Ron of the transistor has a certain functional relationship with a gate voltage Vg of the transistor. A curve of the functional relationship between Ron and Vg is illustrated in FIG. 5. An inverse proportional relationship between Ron and Vg is illustrated in FIG. 5, panel (1). A linear proportional relationship between 1/Ron and Vg is illustrated in FIG. 5, panel (2). The equivalent on-resistance of the n transistors connected in series may be expressed as Req1, Req2, . . . , Reqn.

The resistor circuit includes n resistors and one ground resistor, where n resistors are connected in parallel with the n transistors and configured to provide a DC zero level for the n transistors. n is a positive integer greater than 3. The resistor circuit includes n resistors connected in parallel with the transistors, which may be expressed as Rs1, Rs2, . . . , Rsn. The ground resistor may be expressed as Rg. The values of the resistors Rs1, Rs2, . . . , Rsn are much larger than the equivalent on-resistance values Req1, Req2, . . . , Reqn. The negative feedback characteristics of the negative feedback circuit depend on a total series resistance Req=Req1+Req2 . . . +Reqn. n transistors may be equivalent to n resistors. According to a principle of the negative feedback circuit, under the same current bias condition of the radio frequency amplifier, as Vg is larger, Req is smaller, and a gain of the radio frequency power amplifier is smaller; and as Vg is smaller, Req is larger, and the gain of the radio frequency power amplifier is larger.

The first capacitor is located between the second node and the transistor group circuit, expressed as Cf1, and configured to filter a DC in the circuit.

The second capacitor is located between a third node and the transistor group circuit, expressed as Cf2, and configured to filter a DC in the circuit. The third node is a connection point between the negative feedback circuit and an output of the radio frequency power amplifier.

Figure 7:
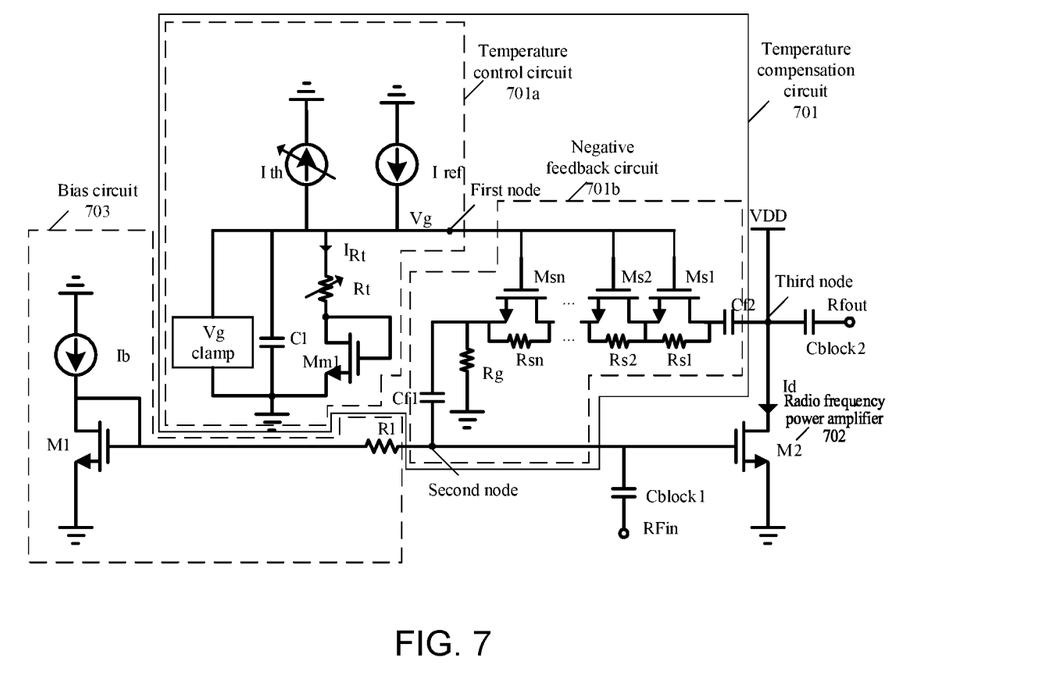
FIG. 7 is a schematic diagram of a specific composition structure of a radio frequency power amplifying circuit according to an embodiment of the disclosure.

The embodiment of the disclosure also provides a radio frequency power amplifying circuit. A basic composition structure of the radio frequency power amplifying circuit is as illustrated in FIG. 7. The radio frequency power amplifying circuit includes: a temperature compensation circuit 701, a radio frequency power amplifier 702 and a bias circuit 703. The temperature compensation circuit includes: a temperature control circuit 701a and a negative feedback circuit 701b.

The temperature control circuit 701a is configured to generate a first electrical signal corresponding to a temperature, and adjust a second electrical signal on a first node according to the first electrical signal. The first node is a connection point between the temperature control circuit 701a and the negative feedback circuit 701b. The connection point here generally refers to any point on a connection between the temperature control circuit 701a and the negative feedback circuit 701b.

The operation that the temperature control circuit 701a generates the first electrical signal corresponding to the temperature includes the following actions. The temperature control circuit 701a may generate a first electrical signal changing with the temperature according to a change in the temperature in the circuit, and when the temperature rises or drops, the first electrical signal is increased or decreased, where the first electrical signal may be a voltage signal or a current signal. The operation that the second electrical signal on the first node is adjusted according to the first electrical signal includes the following actions. The first node connects the temperature control circuit 701a and the negative feedback circuit 701b, therefore, when the first electrical signal changes with the temperature, the electrical signal on the first node may change, that is, the second signal may also change with the temperature, where the second electrical signal may be a voltage signal or a current signal.

The negative feedback circuit 701b is configured to provide, based on the second electrical signal, a negative feedback signal for the radio frequency power amplifier 702 through a second node. The second electrical signal is used to change a resistance value of the negative feedback circuit 701b so as to adjust a negative feedback signal associated with the resistance value. The second node is a connection point between the negative feedback circuit 701b and an input of the radio frequency power amplifier 702. The connection point corresponding to the second node here generally refers to any point on a connection between the negative feedback circuit 701b and the input of the radio frequency power amplifier 702.

The negative feedback signal is to be inputted into the radio frequency power amplifier 702. After the radio frequency power amplifier 702 receives the negative feedback signal, a gain of the radio frequency power amplifier 702 will change. The negative feedback signal changes with the second electrical signal on the first node. After the negative feedback signal is inputted into the radio frequency power amplifier 702, the signal acts as a reaction of the temperature to the gain of the radio frequency power amplifier 702, so that the change caused by the influence of the temperature on the gain of the radio frequency power amplifier 702 may be offset.

For example, the operation that the negative feedback circuit 701b provides, based on the second electrical signal, the negative feedback signal for the radio frequency power amplifier 702 through the second node includes the following action. A resistance value of the negative feedback circuit 701b is controlled by the second electrical signal.

The second electrical signal is used to change the resistance value of the negative feedback circuit 701b so as to adjust the negative feedback signal associated with the resistance value. When the second electrical signal changes with the temperature, the resistance value of the negative feedback circuit 701b also changes with the second electrical signal, thereby changing the negative feedback signal associated with the resistance value. One end of the negative feedback circuit 701b is connected to an input of the radio frequency power amplifier 702 through a second node to provide a negative feedback signal for the radio frequency power amplifier 702 through the second node, and the other end of the negative feedback circuit 701b is connected to an output of the power amplifier 702 through a third node.

The radio frequency power amplifier 702 includes at least one input and at least one output and is configured to amplify an input signal. The input is connected to the second node and configured to receive the input signal. The output is connected to the negative feedback circuit 701b through a third node to output an output signal amplified from the input signal. The gain of the radio frequency power amplifier 702 changes with the temperature.

The radio frequency power amplifier 702 receives an input signal on the input, amplifies the input signal, and outputs the amplified signal on the output. The amplified output signal is an output signal of the radio frequency power amplifier 702. The input signal includes a negative feedback signal fed back by the negative feedback circuit 701b, a DC bias signal provided by the bias circuit 703, and a radio frequency signal provided by an external circuit.

The bias circuit 703 includes a bias signal output. The bias signal output is connected to the second node, and configured to provide a DC bias signal for the radio frequency power amplifier.

The temperature control circuit 701a includes a temperature control power supply, a steady state power supply, a clamping circuit, a filter circuit, and an adjustable resistor circuit.

The temperature control power supply is connected to the adjustable resistor circuit through the first node, and configured to provide an electrical signal changing with a temperature for the adjustable resistor circuit. The electrical signal of the temperature control power supply is positively correlated with an absolute temperature. For example, the electrical signal of the temperature control power supply is directly proportional to a temperature of a current circuit. The absolute temperature is a temperature of the current entire circuit, or an actual temperature value of the temperature control power supply that changes synchronously with a temperature of the radio frequency power amplifier.

The steady state power supply is connected to the adjustable resistor circuit through the first node, and configured to provide an electrical signal having a fixed value for the adjustable resistor circuit. The electrical signal of the steady state power supply does not change with the temperature.

In the present embodiment, the temperature control power supply and the steady state power supply are both current sources. In FIG. 7, Ith represents the temperature control power supply, and Iref represents the steady state current source.

The clamping circuit is connected to the first node, and configured to limit an upper limit of the second electrical signal. The clamping circuit is represented by Vg Clamp in FIG. 7. The clamping circuit may be a simple clamping circuit consisting of circuit components such as a diode, a capacitor and a resistor, or may be a triode clamping circuit consisting of circuit components such as a triode, a capacitor, or a resistor. The electrical signal may be fixed to a specified value by the clamping circuit, thereby stabilizing the electrical signal in the circuit. The clamping circuit having a function of stabilizing an electrical signal may be used in the circuit of the embodiment of the present disclosure.

The filter circuit is connected to the first node, and configured to filter out an interference signal in the second electrical signal. The filter circuit may consist of capacitors and represented by C1 in FIG. 7.

The adjustable resistor circuit is connected to the first node, and configured to adjust the second electrical signal. The adjustable resistor circuit consists of an adjustable resistor Rt and a transistor Mm1 connected in series. Mm1 may offset fluctuations with the process, of a threshold voltage of the group of transistors connected in series in the negative feedback circuit. In an application where a requirement for the temperature compensation performance is not high, Mm1 may be removed to save a chip area.

The negative feedback circuit 701b includes a transistor group circuit, a resistor circuit, a first capacitor, and a second capacitor.

The transistor group circuit includes n transistors connected in series. An input of the transistor is connected to the first node, and configured to cause the resistance value of the negative feedback circuit to change with the second electrical signal. The transistor group circuit includes n transistors connected in series, Ms1, Ms2, . . . , Msn, n being a positive integer greater than 3. Here, the transistor is a metal-oxide-semiconductor (MOS) field effect transistor. A gate of each MOS transistor is connected to the first node. A gate voltage of each MOS transistor is controlled by the second electrical signal on the first node that is Vg.

Figure 6:
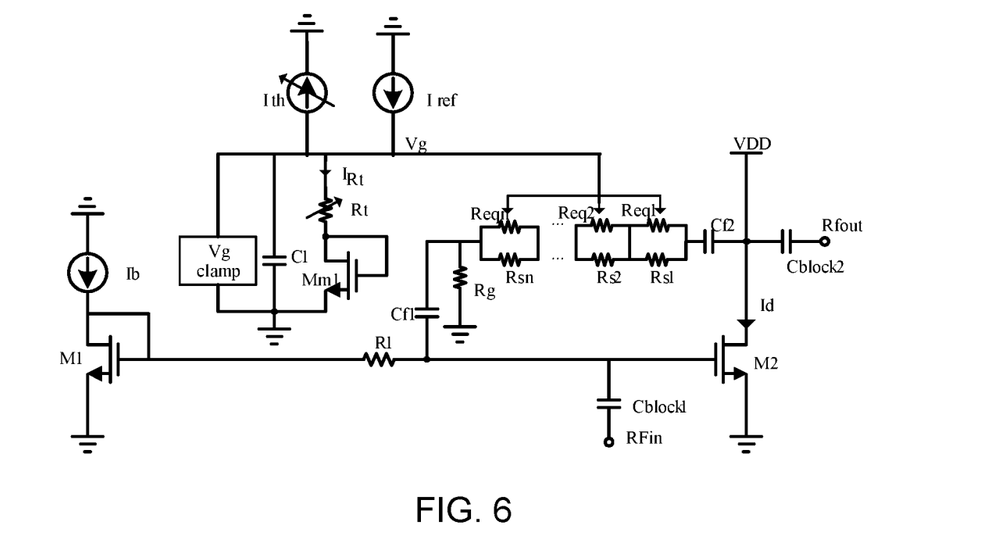
FIG. 6 is a schematic diagram of a specific composition structure of a radio frequency power amplifying circuit where a transistor group is equivalent to a resistor according to an embodiment of the disclosure.

The resistor circuit includes n resistors and one ground resistor. n resistors are connected in parallel with the n transistors for providing a DC zero level for the n transistors, n being a positive integer greater than 3. The resistor circuit includes n resistors connected in parallel with the transistors, which may be expressed as Rs1, Rs2, . . . , Rsn. The ground resistor may be expressed as Rg. The values of the resistors Rs1, Rs2, . . . , Rsn are much larger than equivalent on-resistance values Req1, Req2, . . . , Reqn. The negative feedback characteristics of the negative feedback circuit 701b depend on a total series resistance Req=Req1+Req2 . . . +Reqn. n transistors may be equivalent to n resistors. A schematic diagram of a transistor equivalent to a resistor is illustrated in FIG. 6. According to a principle of the negative feedback circuit, under the same DC bias condition of the radio frequency amplifier 702, as Vg is larger, Req is smaller, and a gain of the radio frequency power amplifier 702 is smaller; and as Vg is smaller, Req is larger, and the gain of the radio frequency power amplifier 702 is larger.

The first capacitor is located between the second node and the transistor group circuit, expressed as Cf1, and configured to filter a DC in the circuit.

The second capacitor is located between a third node and the transistor group circuit, expressed as Cf2, and configured to filter a DC in the circuit. The third node is a connection point between the negative feedback circuit 701b and an output of the radio frequency power amplifier 702.

The radio frequency power amplifier 702 includes an amplifying transistor. An input of the amplifying transistor is connected to the second node. An output of the amplifying transistor is connected to a third node. The radio frequency power amplifier is used to receive an input signal on the input, amplify the input signal and output the signal on the output. A gain of the radio frequency power amplifier 702 is affected by a temperature. When an operating temperature rises from a normal temperature to a high temperature, the gain of the radio frequency power amplifier 702 decreases. When the operating temperature drops from the normal temperature to a low temperature, the gain of the radio frequency power amplifier 702 increases. The normal operating temperature of the radio frequency power amplifier 702 may be set to 25° C. When the operating temperature exceeds the normal operating temperature, the operating temperature is the high temperature, and when the operating temperature is lower than the normal operating temperature, the operating temperature is the low temperature.

Figure 8:
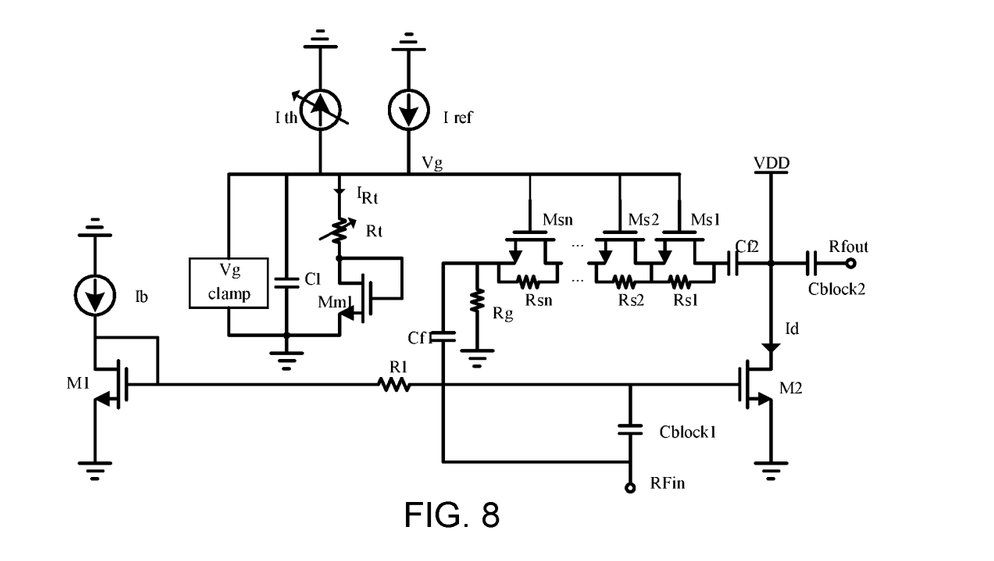
FIG. 8 is a schematic diagram of a specific composition structure of a radio frequency power amplifying circuit of a negative feedback circuit to which a blocking capacitor is accessed according to an embodiment of the disclosure.

Optionally, the radio frequency power amplifier 702 may further include blocking capacitors Cblock1 and Cblock2 for isolating a DC of an external circuit. One end of Cblock1 is connected to the second node, and the other end of Cblock1 is connected to the external circuit. One end of Cblock2 is connected to the third node, and the other end of Cblock2 is connected to the external circuit. One end of the negative feedback circuit 701b connected to the second node may also be connected to one end of Cblock1 connected to the external circuit. The circuit structure in this case is as illustrated in FIG. 8.

The transistor of the radio frequency power amplifier 702 may be an MOS field effect transistor, a heterojunction bipolar transistor (HBT), or a bipolar junction transistor (BJT) and other circuit components with a function of amplifying radio frequency power.

The bias circuit 703 includes a current source Ib, a transistor M1 and a resistor R1. A gate of M1 is connected to one end of R1, and the other end of R1 is connected to a gate of M2 to provide a DC bias current for the radio frequency power amplifier.

When the operating temperature of the radio frequency power amplifying circuit rises from the normal operating temperature to the high temperature, the gain of the radio frequency power amplifier 702 is reduced, affecting the operating performance of the radio frequency power amplifying circuit. In this case, the second electrical signal on the first node that is Vg will decrease with the decrease of Ith. Vg supplies a gate voltage to the group of transistors connected in series in the negative feedback circuit, therefore, when Vg decreases, a total series resistance Req of the group of transistors connected in series increases, thereby weakening the feedback effect of the negative feedback circuit, compensating for the decrease of the gain of the radio frequency power amplifier 702, and realizing the compensation effect of high temperature gain.

When the operating temperature of the radio frequency power amplifying circuit drops from the normal operating temperature to the low temperature, the gain of the radio frequency power amplifier 702 increases, thus the operating performance of the radio frequency power amplifying circuit is affected. In this case, the second electrical signal on the first node, that is Vg, will increase with the increase of Ith. Vg supplies a gate voltage to the group of transistors connected in series in the negative feedback circuit 701b, therefore, when Vg increases, Req of the group of transistors connected in series decreases, thereby enhancing the feedback effect of the negative feedback circuit 701b, suppressing the increase of the gain of the radio frequency power amplifier 702, and realizing the compensation effect of low temperature gain.

Figure 9:
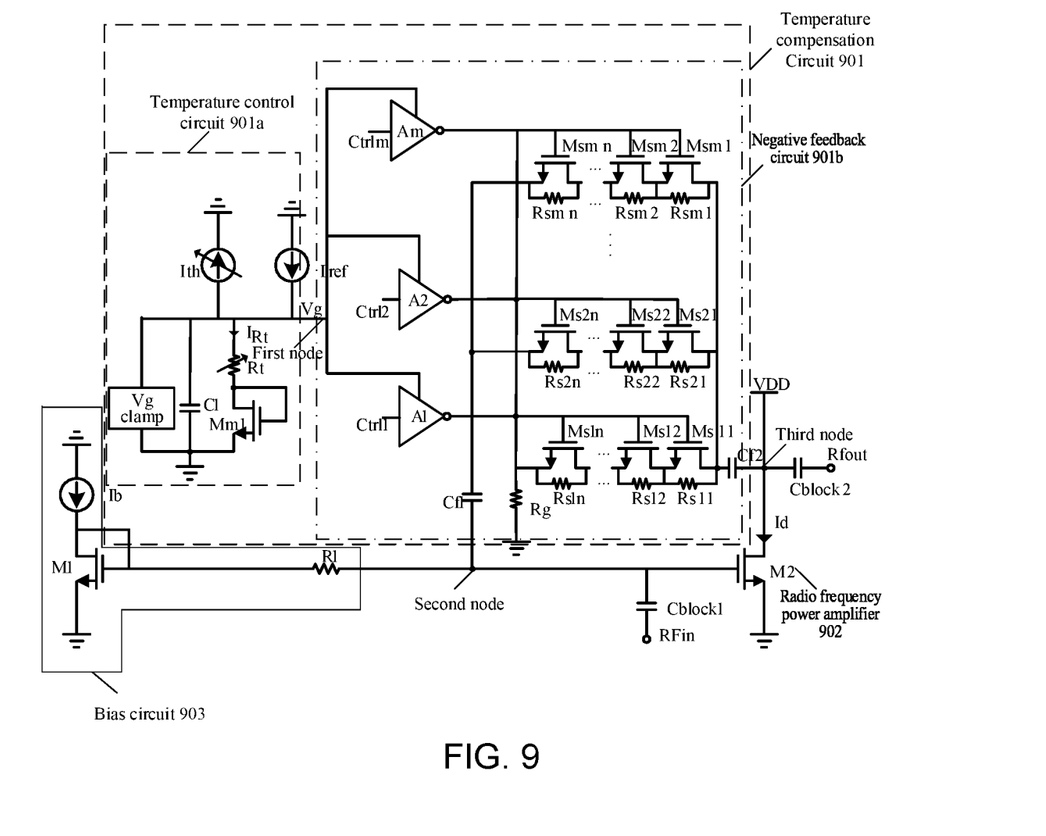
FIG. 9 is a schematic diagram of a specific composition structure of a temperature compensation circuit for a radio frequency power amplifier according to an embodiment of the disclosure.

In the embodiment of the disclosure, the composition of the temperature compensation circuit for the radio frequency power amplifier may be illustrated in FIG. 9. The temperature compensation circuit 901 includes a temperature control circuit 901a and a negative feedback circuit 901b. The temperature control circuit 901a has the same specific composition structure as the temperature control circuit 201 in the foregoing embodiment, and details are not described herein again.

The negative feedback circuit 901b includes an inverter group circuit, a transistor group circuit, a parallel resistor circuit, a first capacitor, and a second capacitor.

The inverter group circuit includes m inverters. An output of each inverter is connected to an input of each transistor group in the transistor group circuit, and an input of each inverter is connected to the first node. The inverter group circuit is used to invert and transmit the second electrical signal to the transistor group circuit, m being a positive integer greater than 1.

The m inverters may be expressed as A1, A2, . . . , Am. A power end of each inverter is connected to the first node, and Vg is used as an input signal. The outputs of the inverters A1, A2, . . . , Am are connected to the gates of the corresponding transistor groups. The inverters A1, A2, . . . , Am may be controlled by logic signals Ctrl1, Ctrl2, . . . , Ctrlm, thereby implementing the function of adjusting various feedback resistance values.

The transistor group circuit includes m transistor groups connected in parallel. Each transistor group includes n transistors connected in series to cause a resistance value of the transistor group circuit to change with the second electrical signal. A gate of each transistor group is connected to an output of the corresponding inverter. m transistor groups connected in parallel are jointly connected to a first capacitor and a second capacitor. A negative feedback path is formed between the output and the input of the radio frequency power amplifier.

The resistor circuit includes m resistor groups and one ground resistor. Each resistor group of the m resistor groups includes n resistors. The n resistors are connected in parallel with the n transistors of each transistor group in the transistor group circuit to provide a DC zero level for the m transistor groups connected in parallel. The n transistors in each path may be equivalent to n resistors, and connected in parallel with n resistors in each path. The resistance of each path depends on a sum of equivalent on-resistances of each transistor. A total resistance of m paths is a total resistance of various resistors connected in parallel. m is a positive integer greater than 1, and n is a positive integer greater than 3.

The first capacitor is located between the second node and the transistor group circuit.

The second capacitor is located between the third node and the transistor group circuit.

A maximum voltage outputted by each inverter in the negative feedback circuit is equal to a voltage of the power end. When Vg changes with the temperature, the maximum voltage output by the inverter also changes with the temperature, thereby achieving temperature compensation for the radio frequency power amplifying circuit.

In the embodiment of the disclosure, a radio frequency power amplifying circuit is also provided. A specific composition structure of the radio frequency power amplifying circuit is illustrated in FIG. 9. The radio frequency power amplifying circuit includes: a temperature compensation circuit 901, a radio frequency power amplifier 902 and a bias circuit 903.

The temperature compensation circuit 901 includes a temperature control circuit 901a and a negative feedback circuit 901b.

The temperature control circuit 901a is configured to generate a first electrical signal corresponding to a temperature, and adjust a second electrical signal on a first node according to the first electrical signal. The first node is any point on a connection between the temperature control circuit 901a and the negative feedback circuit 901b.

The negative feedback circuit 901b is configured to provide, based on the second electrical signal, a negative feedback signal for the radio frequency power amplifier through a second node. The second electrical signal is used to change a resistance value of the negative feedback circuit 901b so as to adjust a negative feedback signal associated with the resistance value. The second node is a point on a connection between the negative feedback circuit and an input of the radio frequency power amplifier 902. The negative feedback signal is used to be inputted into the radio frequency power amplifier such that a gain of the radio frequency power amplifier 902 changes.

The radio frequency power amplifier 902 includes at least one input and at least one output for amplifying an input signal.

The input is connected to the second node and configured to receive the input signal. The output is connected to the negative feedback circuit through a third node and used to output an output signal amplified from the input signal. A gain of the radio frequency power amplifier 902 changes with a temperature.

The bias circuit 903 includes a bias signal output end. The bias signal output is connected to the second node, and configured to provide a DC bias signal for the radio frequency power amplifier 902.

The radio frequency power amplifier 902 and the bias circuit 903 have the same specific composition structures of the radio frequency power amplifier 202 and the bias circuit 203 in the foregoing embodiment, and details are not described herein again.

Figure 10:
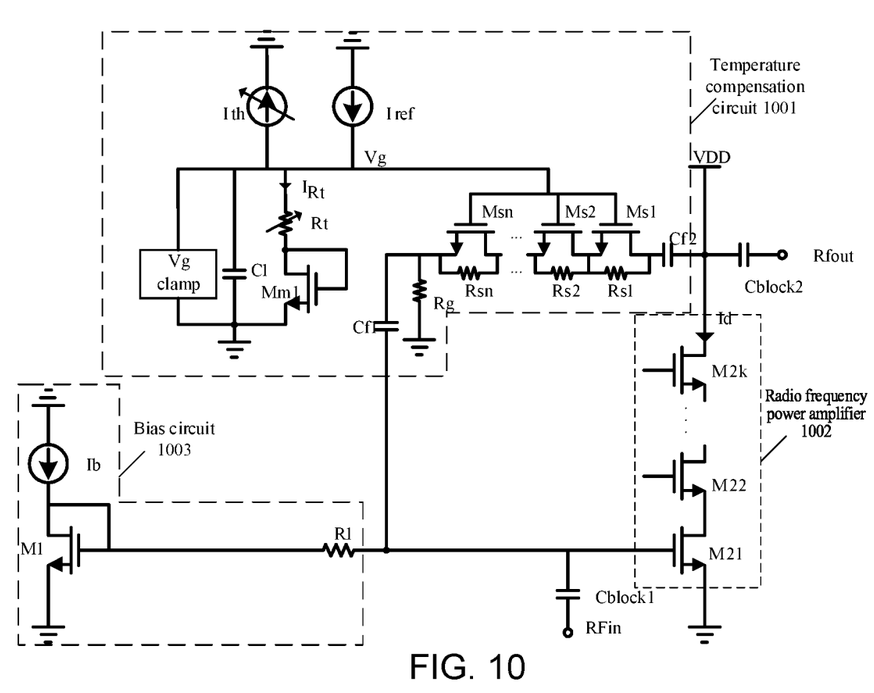
FIG. 10 is a schematic diagram of a specific composition structure of a radio frequency power amplifying circuit according to an embodiment of the disclosure.

In the embodiment of the disclosure, a specific composition structure of the radio frequency power amplifying circuit is illustrated in FIG. 10. The temperature compensation circuit 1001, the radio frequency power amplifier 1002 and the bias circuit 1003 may be implemented in any one of the foregoing embodiments, and details are not described herein again.

The radio frequency power amplifier 1003 includes n amplifying transistors connected in series. An input of each transistor is connected to the second node, and the n transistors may be expressed as M21, M22, . . . , M2k, where k is a positive integer greater than 1. A source of M2k is connected to the third node, and a drain of M21 is grounded. A power gain of the radio frequency power amplifier is a total gain of the amplifying transistors connected in series.

The above is only the preferred embodiment of the disclosure and is not intended to limit the scope of protection of the disclosure. Any modification made within the principle of the disclosure falls within the scope of protection of the disclosure.

According to the temperature compensation circuit and the radio frequency power amplifying circuit in the embodiment of the disclosure, the temperature control circuit may be used to generate a second electrical signal corresponding to a temperature, and then provide the second electrical signal for the negative feedback circuit. The negative feedback circuit provides, based on the second electrical signal, a negative feedback signal associated with a temperature for the radio frequency power amplifier, so that the influence of the temperature on the radio frequency power amplifier can be at least partially offset by the generation of a negative feedback signal, thereby improving the stability of the radio frequency power amplifier operating in a linear amplification area, and improving the linear amplification performance of the radio frequency power amplifier. It has positive industrial effects and simple implementation and can be widely used in industry.

The invention claimed is:

1. A temperature compensation circuit for a radio frequency power amplifier, wherein the temperature compensation circuit comprises a temperature control circuit and a negative feedback circuit, wherein:
the temperature control circuit is connected to the negative feedback circuit, and configured to generate a first electrical signal corresponding to a temperature, and adjust a second electrical signal on a first node according to the first electrical signal, wherein the first node is a point on a connection between the temperature control circuit and the negative feedback circuit;
the negative feedback circuit is connected to an input of the radio frequency power amplifier, and configured to provide a negative feedback signal for the radio frequency power amplifier based on the second electrical signal, wherein the second electrical signal is used to change a resistance value of the negative feedback circuit to adjust a negative feedback signal associated with the resistance value;
the negative feedback signal is used to be inputted into the radio frequency power amplifier to change a gain of the radio frequency power amplifier;
the temperature control circuit comprises a temperature control power supply, a steady state power supply, a clamping circuit, a filter circuit, and an adjustable resistor circuit;
the temperature control power supply is connected to the adjustable resistor circuit through the first node, and configured to provide an electrical signal that changes with the temperature for the adjustable resistor circuit;
the steady state power supply is connected to the adjustable resistor circuit through the first node, and configured to provide an electrical signal having a fixed value for the adjustable resistor circuit;
the clamping circuit is connected to the first node, and configured to limit an upper limit of the second electrical signal;
the filter circuit is connected to the first node, and configured to filter out an interference signal in the second electrical signal; and
the adjustable resistor circuit is connected to the first node, and configured to adjust the second electrical signal.

2. A temperature compensation circuit for a radio frequency power amplifier, wherein the temperature compensation circuit comprises a temperature control circuit and a negative feedback circuit, wherein:
the temperature control circuit is connected to the negative feedback circuit, and configured to generate a first electrical signal corresponding to a temperature, and adjust a second electrical signal on a first node according to the first electrical signal, wherein the first node is a point on a connection between the temperature control circuit and the negative feedback circuit;
the negative feedback circuit is connected to an input of the radio frequency power amplifier, and configured to provide a negative feedback signal for the radio frequency power amplifier based on the second electrical signal, wherein the second electrical signal is used to change a resistance value of the negative feedback circuit to adjust a negative feedback signal associated with the resistance value;
the negative feedback signal is used to be inputted into the radio frequency power amplifier to change a gain of the radio frequency power amplifier;
wherein:
the negative feedback circuit comprises a transistor group circuit, a resistor circuit, a first capacitor, and a second capacitor;
the transistor group circuit comprises n transistors connected in series, wherein a gate of the transistor is connected to the first node to cause the resistance value of the negative feedback circuit to change with the second electrical signal;
the resistor circuit comprises n resistors and one ground resistor, wherein the n resistors are connected in parallel with the n transistors to provide a DC zero level for the n transistors, n being a positive integer greater than 3;
the first capacitor is located between the second node and the transistor group circuit, wherein the second node is a point on a connection between the negative feedback circuit and the input of the radio frequency power amplifier; and
the second capacitor is located between a third node and the transistor group circuit, wherein the third node is a point on a connection between the negative feedback circuit and an output of the radio frequency power amplifier.

3. The circuit according to claim 1, wherein the negative feedback circuit comprises an inverter group circuit, a transistor group circuit, a parallel resistor circuit, a first capacitor and a second capacitor, wherein:
the inverter group circuit comprises m inverters, wherein an output of each inverter is connected to an input of each transistor group in the transistor group circuit, and an input of each inverter is connected to the first node to invert and transmit the second electrical signal to the transistor group circuit;
the transistor group circuit comprises m transistor groups connected in parallel, wherein each transistor group comprises n transistors connected in series to cause a resistance value of the transistor group circuit to change with the second electrical signal;
the resistor circuit comprises m resistor groups and one ground resistor, wherein each resistor group of the m resistor groups comprises n resistors, the n resistors are connected in parallel with the n transistors of each transistor group of the transistor group circuit to provide a DC zero level for the m transistor groups connected in parallel;

the first capacitor is located between the second node and the transistor group circuit; and the second capacitor is located between a third node and the transistor group circuit, wherein the third node is a point on a connection between the negative feedback circuit and an output of the radio frequency power amplifier, m being a positive integer greater than 1, and n being a positive integer greater than 3.

4. A radio frequency power amplifying circuit, wherein the radio frequency power amplifying circuit comprises a temperature compensation circuit and a radio frequency power amplifier, wherein:

the temperature compensation circuit comprises a temperature control circuit and a negative feedback circuit;

the temperature control circuit is configured to generate a first electrical signal corresponding to a temperature, and adjust a second electrical signal on a first node according to the first electrical signal, wherein the first node is a point on a connection between the temperature control circuit and the negative feedback circuit;

the negative feedback circuit is configured to provide, based on the second electrical signal, a negative feedback signal for the radio frequency power amplifier through a second node, wherein the second electrical signal is used to change a resistance value of the negative feedback circuit to adjust the negative feedback signal associated with the resistance value, and the second node is a point on a connection between the negative feedback circuit and an input of the radio frequency power amplifier;

the negative feedback signal is used to be inputted into the radio frequency power amplifier to change a gain of the radio frequency power amplifier;

the radio frequency power amplifier comprises at least one input and at least one output and is configured to amplify an input signal;

the input of the radio frequency power amplifier is connected to the second node and configured to receive the input signal;

the output of the radio frequency power amplifier is connected to the negative feedback circuit through a third node and used to output an output signal amplified from the input signal, wherein the gain of the radio frequency power amplifier changes with the temperature, and the third node is a point on a connection between the negative feedback circuit and the output of the radio frequency power amplifier;

the negative feedback circuit comprises an inverter group circuit, a transistor group circuit, a parallel resistor circuit, a first capacitor and a second capacitor;

the inverter group circuit comprises m inverters, wherein an output of each inverter is connected to an input of each transistor group in the transistor group circuit, and an input of each inverter is connected to the first node to invert and transmit the second electrical signal to the transistor group circuit;

the transistor group circuit comprises m transistor groups connected in parallel, wherein each transistor group comprises n transistors connected in series to cause a resistance value of the transistor group circuit to change with the second electrical signal;

the resistor circuit comprises m resistor groups and one ground resistor, wherein each resistor group of the m resistor groups comprises n resistors, the n resistors are connected in parallel with the n transistors of each transistor group of the transistor group circuit to provide a DC zero level for the m transistor groups connected in parallel;

the first capacitor is located between the second node and the transistor group circuit; and the second capacitor is located between a third node and the transistor group circuit, wherein the third node is a point on a connection between the negative feedback circuit and an output of the radio frequency power amplifier, m being a positive integer greater than 1, and n being a positive integer greater than 3.

5. The circuit according to claim 4, wherein the circuit further comprises a bias circuit, wherein the bias circuit comprises a bias signal output; and the bias signal output is connected to the second node, and configured to provide a DC bias signal for the radio frequency power amplifier.

6. The circuit according to claim 4, wherein the radio frequency power amplifier comprises an amplifying transistor, and an input of the amplifying transistor is connected to the second node.

7. The circuit according to claim 4, wherein the radio frequency power amplifier comprises n amplifying transistors connected in series, and an input of a first amplifying transistor is connected to the second node.

8. The circuit according to claim 4, wherein the radio frequency power amplifier further comprises a blocking capacitor configured to connect the second node and the negative feedback circuit.

9. A mobile communication system comprising a plurality of radio frequency power amplifying circuits each having a temperature compensation circuit according to claim 1, wherein the radio frequency power amplifier is configured to, based on the negative feedback signal, compensate for effects of the temperature, thereby reducing influence of the temperature on the radio frequency power amplifier, improving amplification linearity of the radio frequency power amplifier affected by temperature compensation of a bias circuit on an operating point of the radio frequency power amplifier, stabilizing the operating point of the radio frequency power amplifier, and improving stability and operating efficiency of the radio frequency power amplifier.

* * * * *